United States Patent [19]

Honjo et al.

[11] Patent Number: 4,783,622
[45] Date of Patent: Nov. 8, 1988

[54] FREQUENCY ABNORMALITY DETECTING CIRCUIT

[75] Inventors: Kenji Honjo; Tooru Nakamura, both of Hyogo, Japan

[73] Assignee: Mitsubishi Denki Kabushiki Kaisha, Tokyo, Japan

[21] Appl. No.: 42,249

[22] Filed: Apr. 24, 1987

[30] Foreign Application Priority Data

Apr. 25, 1986 [JP] Japan .................................. 61-94794

[51] Int. Cl.$^4$ ............................................. G01R 33/20
[52] U.S. Cl. .................................. 324/78 D; 324/78 Z
[58] Field of Search ............... 324/78 D, 78 E, 78 A, 324/78 Z; 340/658; 364/484; 328/129.1, 134, 138

[56] References Cited

U.S. PATENT DOCUMENTS

| 4,123,704 | 10/1978 | Johnson | 324/78 D |
| 4,442,406 | 4/1984 | Voss | 307/526 |
| 4,564,837 | 1/1986 | Awano | 340/658 |

OTHER PUBLICATIONS

Radio Gijutsu Sha Co., Ltd., "Digital IC Practical Circuit Manual", Jul. 10, 1974, pp. 416–417.

*Primary Examiner*—Stewart J. Levy
*Assistant Examiner*—Louis M. Arana
*Attorney, Agent, or Firm*—Bernard, Rothwell & Brown

[57] ABSTRACT

A frequency abnormality detecting circuit for detecting the frequency abnormality of an AC power source, comprises a waveform shaping circuit for shaping an output waveform (detection waveform) of the AC power source, which is an object to be detected; a frequency demultiplier for demultiplying an output of the waveform shaping circuit at least by one period of the dection waveform; a counter for counting an output pulse of a reference oscillator by the leading edge of an output pulse of the demultiplier; a memory circuit such as a read only memory (ROM) for storing bit data using output data of the counter as an address; an OR gate for performing an OR operation of an output of the memory circuit; a switch device for inputting the output of the memory circuit into the OR gate; and a flip-flop for operating in synchronism with the output pulse of the frequency demultiplier using an output of the OR gate as data input.

7 Claims, 3 Drawing Sheets

4,783,622

FREQUENCY ABNORMALITY DETECTING CIRCUIT

BACKGROUND OF THE INVENTION

1. Field of the Invention

The present invention relates to a detecting circuit for detecting the abnormality of the frequency of an alternating current (AC) power source and, more particularly, to a frequency abnormality detecting circuit for detecting abnormality through a true-false decision of the count number of an output pulse, which is obtained by the waveform shaping and frequency demultiplying of the AC.

2. Description of the Prior Art

For an integrated circuit (referred to hereunder simply as "IC") whose input and output operate using only binary voltages (for example, +5 V and 0 V) as variables, a digital IC has been developed and applied to various technical fields. Customarily, this digital IC is employed even in the case of a detection of the frequency abnormality of an AC power source. For example, a frequency discriminating circuit, which is composed of retriggerable monostable multivibrators and D-type flip-flops, is disclosed on pp. 416–417 of the first edition of the "Manual for Practical Use of a Digital IC Circuit" published in July 1974 by Radio Technical Corp.

FIG. 1 shows substantially the same circuit as the frequency discriminating circuit shown in FIG. 15.10 on page 417 of the above-referenced publication. The circuit of FIG. 1 comprises an AC power source 1, a waveform shaping circuit 2, retriggerable monostable multivibrators 3 and 4, D-type flip-flops 5 and 6, and an OR gate 7.

The operation of the FIG. 1 circuit will be described referring to FIG. 2.

The monostable multivibrators 3 and 4 have oneshot pulse width $\tau 1$ and $\tau 2$, respectively. It is assumed that the relationship of $\tau 2 < \tau < \tau 1$ is established where the period of the AC power source 1 to be detected is $\tau$ in a normal state. The multivibrators 3 and 4 are triggered by the rising or leading edge of a signal V2, which is obtained by the waveform shaping of a signal V1 of the AC power source 1. The flip-flops 5 and 6 store the output signals of the multivibrators 3 and 4 in synchronism with the signal V2. After the multivibrators 3 and 4 are triggered once their outputs continue if they are triggered again within each one-shot time. The OR gate 7 performs an OR operation of respective outputs $\overline{Q}$ and Q of the flip-flops 5 and 6.

As shown in FIG. 2, when a zero-crossing time point T1 of the AC power source 1 becomes $$T1 < \tau 2 < \tau 1,$$

signals P11 and P12 from the multivibrators 3 and 4 remain at H (a high level), and a detection output F takes H at the time point T1 to detect the frequency abnormality of the AC power source.

However, because the conventional frequency abnormality detecting circuit is constructed as mentioned above, the detection accuracy of the circuit is limited to the accuracy (normally about ±1%) of each one-shot time of the multivibrators 3 and 4. Particularly, in the detection of the frequency abnormality of a commercial power source, the use of such a conventional detecting circuit becomes impractical, since the detection accuracy of 1% or less than 1% is required. Also, the alteration of a detection value causes a problem that such components as a capacitor or a resistor for determining the time constants of the retriggerable monostable multivibrators must be altered consequently.

SUMMARY OF THE INVENTION

An object of the invention is, therefore, to provide a frequency abnormality detecting circuit capable of greatly improving the accuracy of a frequency abnormality detection.

Another object of the invention is to provide a frequency abnormality detecting circuit capable of easily altering the detection value of a abnormality detection using a switch device, etc.

To achieve the above-mentioned objects, a frequency abnormality detecting circuit of the invention comprises: a waveform shaping circuit for shaping an output waveform of the AC power source to be detected; a frequency demultiplier for frequency demultiplying an output of the waveform shaping circuit; a counter for counting an output of a reference oscillator by the leading edge of an output pulse of the frequency demultiplier; a read only memory (ROM) for storing bit data using output data of the counter as an address; an OR gate for performing an OR operation of an output of the ROM; a switch device for inputting the output of the ROM into the OR gate; and a flip-flop for operating in synchronism with the output of the frequency demultiplier using an output of the OR gate as data input.

BRIEF DESCRIPTION OF THE DRAWINGS

In the drawings, identical reference numerals denote identical structural elements.

DETAILED DESCRIPTION OF THE PREFERRED EMBODIMENT

Figure 1:
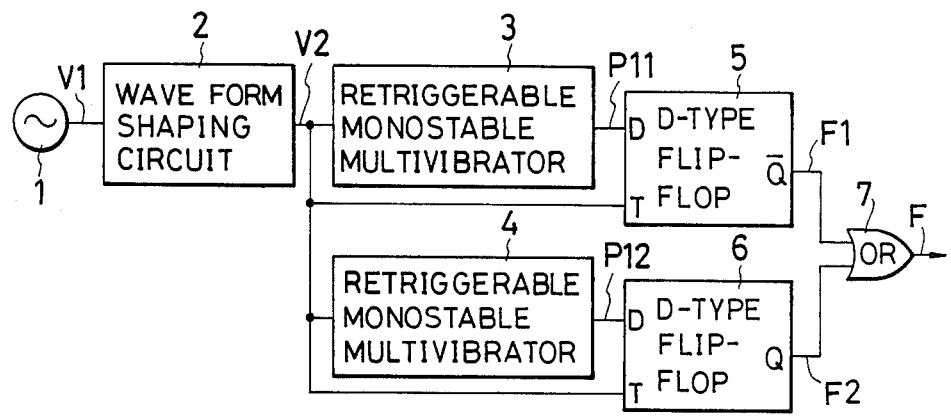
FIG. 1 shows a block diagram of a conventional frequency abnormality detecting circuit.
Figure 2:
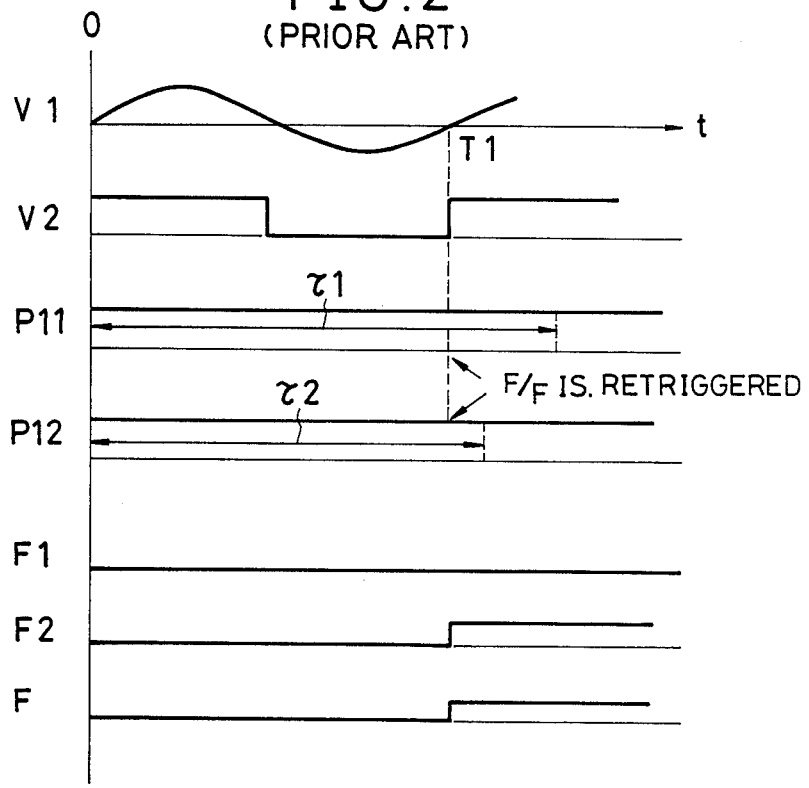
FIG. 2 shows a signal timing chart for describing the operation of each part of the conventional detecting circuit of FIG. 1.

An embodiment of the present invention will be described hereunder referring to the drawings.

Figure 3:
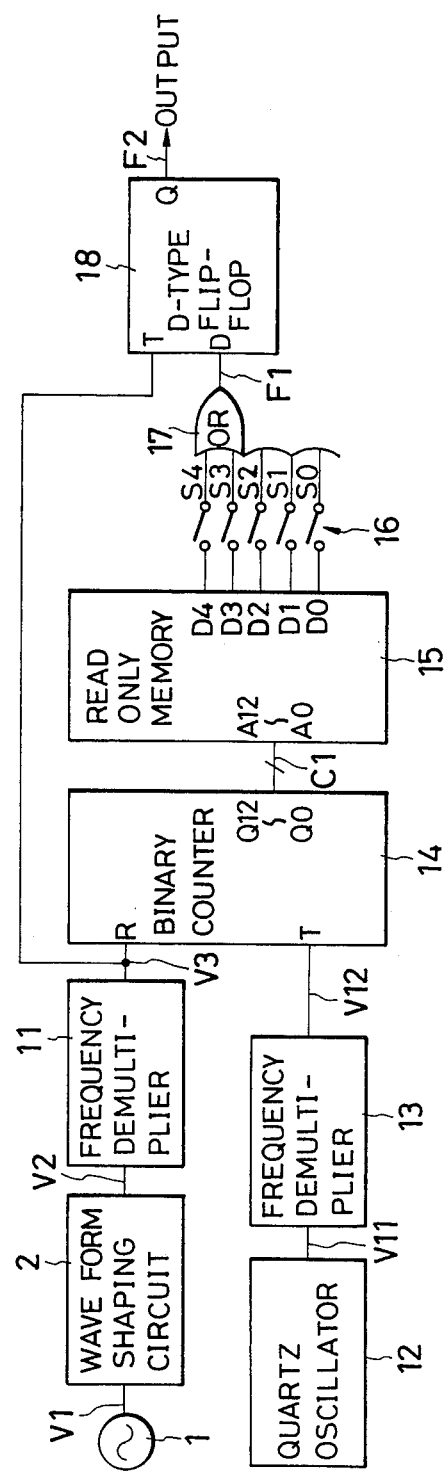
FIG. 3 is a block diagram of one embodiment of a frequency abnormality detecting circuit of the present invention.

Referring to FIG. 3, the embodiment of the invention comprises an AC power source 1, a waveform shaping circuit 2, a first frequency demultiplier 11, a quartz oscillator 12 serving as a reference oscillator, a second frequency demultiplier 13, a binary counter (referred to hereunder simply as "counter") 14, a ROM (read only memory) 15, a switch device 16, an OR gate 17, and a D-type flip-flop 18.

Figure 4:
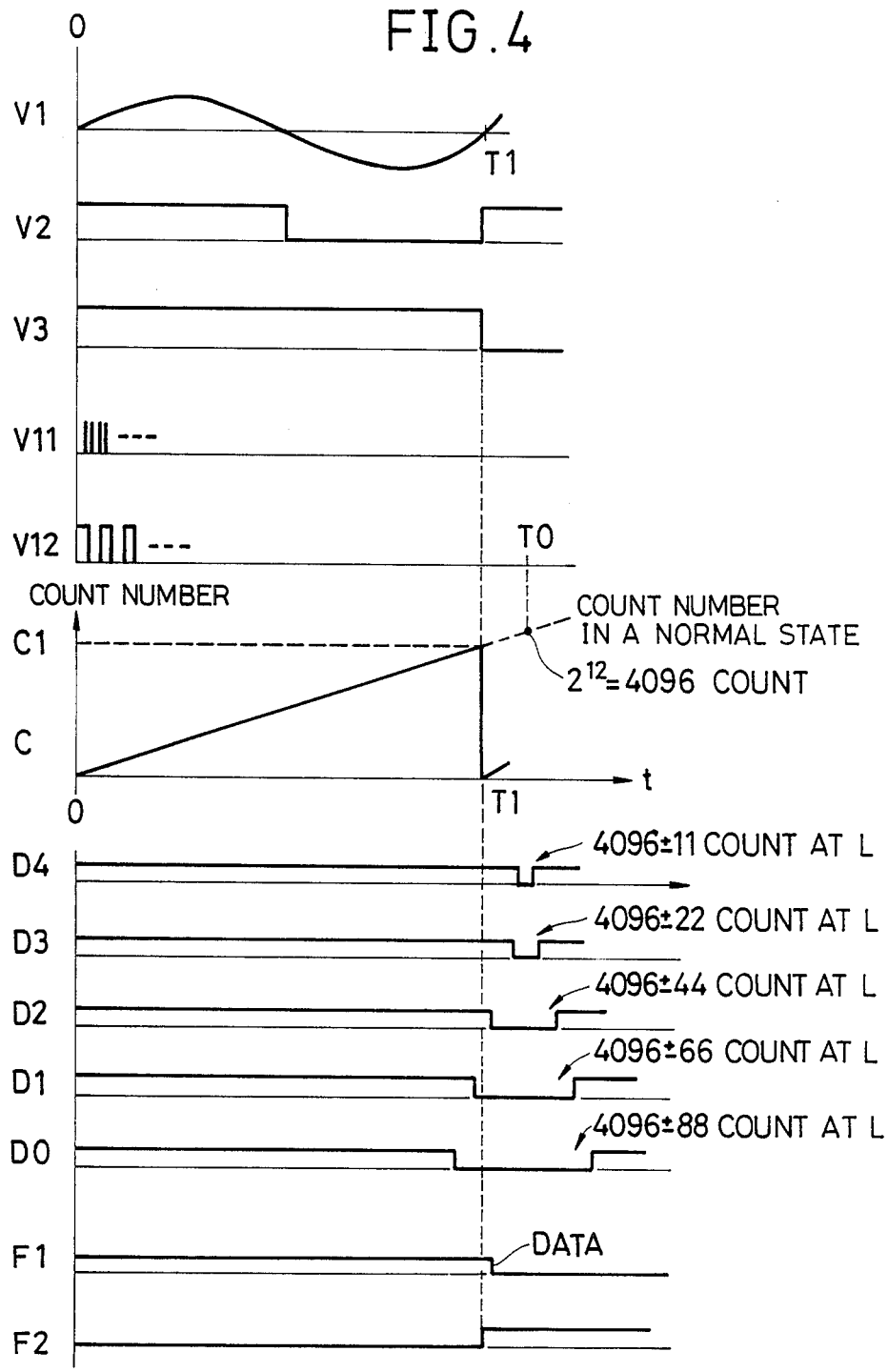
FIG. 4 shows a signal timing chart for describing the operation of each part of the detecting circuit illustrated in FIG. 3.

The operation of the embodiment will be described with reference to FIGS. 3 and 4. A signal V1 given from the AC power source 1 is subjected to waveform shaping at the circuit 2 and output as a signal V2. The signal V2 is then supplied to the first frequency demultiplier 11 to become a signal V3 having a frequency of one-half of that of the signal V2. On the other hand, an output pulse V11 from the oscillator 12 is frequency-demultiplied into a signal V12 at the second frequency demultiplier 13. The counter 14 is set at the leading edge of the signal V3 to start the counting operation of the signal V12. The counter 14 counts one period of an AC waveform, that is, the period from a time point 0 to a time point T1 in FIG. 4. Assuming now that the counter 14 has a 13-bit structrre, it counts $2^{12}=4096$ until a time point T0 if the frequency of the AC power source is normal. However, as shown in FIG. 4, the counter 14 is reset when it counts a count number C1, since the period of the AC waveform V1 is short (in other words, the frequency of the waveform V1 is high) and since the counter is reset at the time point T1. Immediately before the resetting of the counter 14, data stored at a corresponding address of the ROM 15 are read out using the count number C1 as an address. Assuming now that data stored at bits D0 to D4 of the ROM 15 are $4096 \pm 88$, $4096 \pm 66$, $4096 \pm 44$, $4096 \pm 22$, and $4096 \pm 11$, the bit data become D0=0, D1=0, D2=1, D3=1, and D4=1 at the time point T1. Also, assuming that switches S0, S1 and S2 of the switch device 16 turn "ON", the output of the OR gate takes a signal F1 shown in FIG. 4, and the output of the D-type flip-flop 18 becomes a signal F2 in synchronism with the output signal V3 of the first frequency demultiplier 11. As a result, an abnormal state at the time point T1 can be detected.

In addition, by selecting the bit data D0 to D4 as shown in FIG. 4, the detection values are given below.

Bit $D4$ ($4096 \pm 11$ count at a low level ($L$)) . . .

$$\frac{\pm 11}{4096} \times 100 = \pm 0.26\%$$

Bit $D3$ ($4096 \pm 22$ count at ($L$)) . . .

$$\frac{\pm 22}{4096} \times 100 = \pm 0.53\%$$

Bit $D2$ ($4096 \pm 44$ count at ($L$)) . . .

$$\frac{\pm 44}{4096} \times 100 = \pm 1.07\%$$

Bit $D1$ ($4096 \pm 66$ count at ($L$)) . . .

$$\frac{\pm 66}{4096} \times 100 = \pm 1.61\%$$

Bit $D0$ ($4096 \pm 88$ count at ($L$)) . . .

$$\frac{\pm 88}{4096} \times 100 = \pm 2.14\%$$

As has been described above, adequate values are obtained as the detection values for detecting the frequency abnormality of an ordinary commercial power source. In addition, the selection of an arbitrary one among said detection values can be attained by selecting the ON-OFF operation of the switches S0, S1, S2, S3 and S4 of the switch device 16.

Although the counter 14 having a 13-bit structure has been described in the above-mentioned embodiment, detection accuracy can be relatively improved with the increase of the count number at a normal state by increasing the bit number of the counter 14.

Furthermore, a detection time can be delayed with the provision of a timer circuit next to an abnormal detection output in the embodiment.

In the embodiment, the setting of the detection levels can arbitrarily done at the step of $1/4096 \times 100 = 0.0244(\%)$ and those levels corresponding to the data bit number of the ROM 15 can be stored. The selection of an arbitrary number of the detection levels can be attained by increasing the capacity of the ROM 15 and the selection switches of the ROM data output when necessary.

As has been described above, according to this invention, a detection waveform is waveform-shaped and frequency-demultiplied to detect frequency abnormality. The demultiplied output is used as a rising pulse to count an output pulse from the reference oscillator. The bit data are stored into the ROM using the output data of the counter as an address, and the output of the ROM is inputted to the OR gate through the switch device. The output of the OR gate is given to the data input of the flip-flop whose output is forced to rise in synchronism with the output of the first frequency demultiplier. As a result, the structure of the invention allows the realization of high detection accuracy and arbitrary selection of the detection values with only the alteration of the data stored in the ROM.

What is claimed is:

1. A frequency abnormality detecting circuit, comprising:

waveform shaping means for shaping an output waveform of an AC power source, which is a detection object of frequency abnormality;

reference oscillation means for producing a reference output;

frequency-demultiplying means for frequency-demultiplying an output of said waveform shaping means at least by one period of said waveform;

counting means for counting the output pulse of the reference oscillation means by the leading edge of an output pulse of the frequency-demultiplying means;

storing means for storing bit data using output data of the counting means as an address;

OR means for performing an OR operation of an output of said storing means;

switch means provided between the storing means and the OR means for inputting said output of the storing means to the OR means; and bistable means for operation in synchronism with an output of said demultiplying means using an output of the OR means as data input.

2. A frequency abnormality detecting circuit as claimed in claim 1, wherein said reference oscillation means is composed of a quartz oscillator and said frequency-demultiplying means is made up of a first frequency demultiplier.

3. A frequency abnormality detecting circuit as claimed in claim 2, further comprising a second frequency demultiplier for frequency-demultiplying an output of the quart oscillator.

4. A frequency abnormality detecting circuit as claimed in claim 1, wherein said counting means is made up of a binary counter responsive to a signal based on a voltage to be detected and an output signal from said reference oscillation means.

5. A frequency abnormality detecting circuit as claimed in claim 1, wherein said storing means is composed of a read only memory comprising an integrated circuit.

6. A frequency abnormality detecting circuit as claimed in claim 1, said bistable means is composed of a flip-flop circuit.

7. A frequency abnormality detecting circuit as claimed in claim 6, wherein said flip-flop circuit is constructed by a D-type flip-flop circuit for holding input data and delaying it by one clock period.

* * * * *

UNITED STATES PATENT AND TRADEMARK OFFICE
CERTIFICATE OF CORRECTION

PATENT NO. : 4,783,622

DATED : November 8, 1988

INVENTOR(S) : Kenji Honjo et al.

It is certified that error appears in the above-identified patent and that said Letters Patent is hereby corrected as shown below: Title page:

In the Abstract, line 8, "dection" should be --detection--.

Column 1, line 38, "oneshot" should be --one-shot--;

line 48, after "once" insert a comma --,--.

Column 3, line 6, "structrre" should be --structure--;

line 20, after "gate" insert --17--.

Column 4, line 51, "quart" should be --quartz--;

line 62, after "1" insert --wherein--.

Signed and Sealed this

Twentieth Day of March, 1990

Attest:

JEFFREY M. SAMUELS

Attesting Officer

Acting Commissioner of Patents and Trademarks